July 22, 1969 E. WEISSHAAR ET AL 3,457,474
SEMICONDUCTOR RECTIFIER STRUCTURE HAVING SEMICONDUCTOR ELEMENT ASSEMBLY SCREWED INTO PLACE ON SUPPORT BASE
Original Filed March 29, 1963
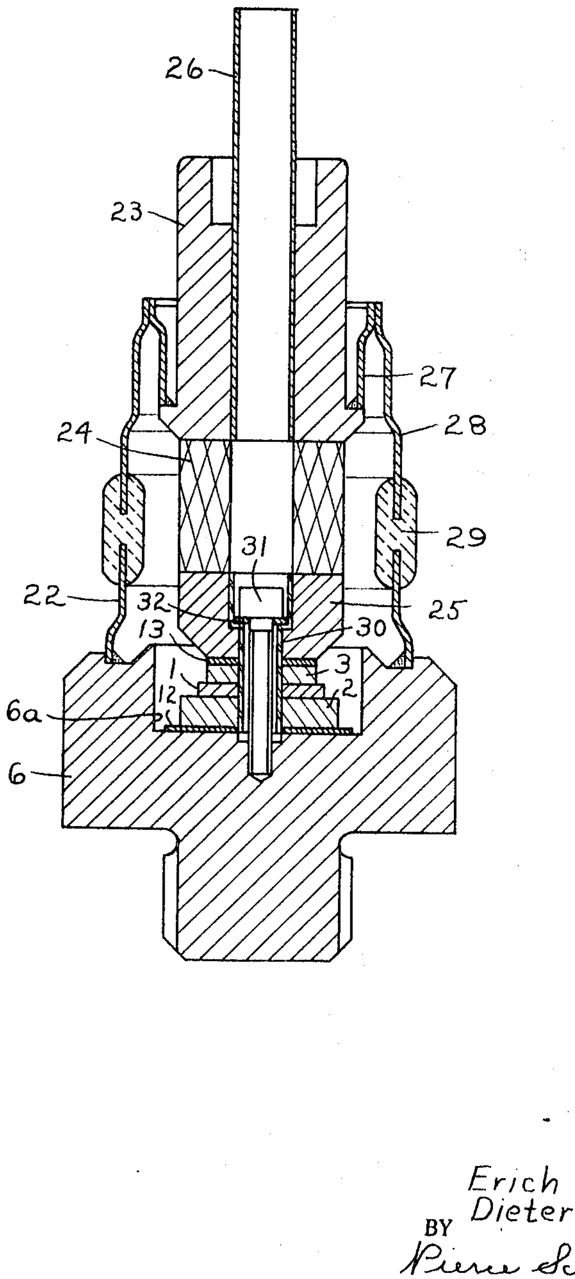
INVENTORS
Erich Weisshaar
Dieter Spickenreuther
BY
Pierce Scheffler & Parker
Attorneys

United States Patent Office 3,457,474
Patented July 22, 1969

3,457,474

SEMICONDUCTOR RECTIFIER STRUCTURE HAVING SEMICONDUCTOR ELEMENT ASSEMBLY SCREWED INTO PLACE ON SUPPORT BASE

Erich Weisshaar and Dieter Spickenreuther, Baden, Switzerland, assignors to Aktiengesellschaft Brown, Boveri & Cie, Baden, Switzerland, a joint-stock company Original application Mar. 29, 1963, Ser. No. 268,982. Divided and this application Nov. 30, 1966, Ser. No. 608,475
Claims priority, application Switzerland, Mar. 30, 1962, 3,926/62
Int. Cl. H01l *3/00, 5/00;* B01j *17/00*
U.S. Cl. 317—234 3 Claims

ABSTRACT OF THE DISCLOSURE

A semiconductor rectifier structure comprises a semiconductor element assembly located within an evacuated housing, the housing including a conductive base part having a recess in which is located an annularly configured disc of semiconductor material to each side of which a carrier plate is soldered. The electrical lead into the housing terminates in an annularly configured contact member, and a fastening screw which extends through the central opening in the contact member and the sub-assembly of the semiconductor disc and its carrier plates into a threaded hole in the base is used to secure the semiconductor sub-assembly in place to establish good thermal and electrical contact between the electrical lead, semiconductor sub-assembly and base.

The present application, which is a division of application Ser. No. 268,982, filed Mar. 29, 1963, now abandoned, relates to a semiconductor arrangement, wherein the semiconductor element comprises carrier plates which are soldered to the semiconductor body on both sides and the coefficients of thermal expansion of which are at least substantially equal to that of the semiconductor body, said plates being connected over a large area to plane surfaces of metal members having any desired coefficient of thermal expansion, particularly different coefficients of thermal expansion.

In order to feed in the current and above all to draw off the heat due to energy losses in the semiconductor body, the semiconductor element must be in satisfactory electrical and thermal contact with metal members such as the bottom of a housing and a current-supply pin or a lead-in wire. The connection of the semiconductor element to these parts is effected in the usual manner by means of solder. Apart from affording good contact, the solders have to satisfy other conditions some of which are contradictory. Since any great mechanical stress on the semiconductor body should be excluded, the use of soft ductile solders appears advantageous, particularly in conjunction with a carrier plate which is soldered to the semiconductor body and the coefficient of thermal expansion of which is substantially equal to that of the semiconductor body, as for example with a carrier plate consisting of molybdenum or tungsten when the semiconductor body is of silicon. In such an arrangement, the forces arising as a result of the different coefficients of thermal expansion of the carrier plate and of the metal member connected thereto are taken up by the layer of soft solder situated between the two. When the arrangement is subjected to varying thermal stress, fatigue phenomena appear in the soldered joint as a result of plastic flow and recrystallization processes, and lead to severing of the soldered joint and hence to the failure of the semiconductor arrangement.

In order to overcome this disadvantage, numerous proposals have already been made. One in particular is to connect the carrier plate and metal member by means of a layer of hard solder which is not permanently deformed by the resulting internal stresses. In order to have these internal stresses transferred to the metal member, the carrier plate must have a considerable thickness. As a result, however, the heat transfer from the semiconductor element to the heat sink deteriorates. Above all, however, it is a disadvantage that the high temperatures necessary for carrying out the hard-soldering have a harmful effect on the blocking capacity of the semiconductor element, whether through vaporization of soldering or housing materials, or through diffusion of metal substances such as copper into the semiconductor or even through variations in the surface condition of the semiconductor element itself.

The semiconductor arrangement according to the invention, wherein the semiconductor element likewise comprises carrier plates which are soldered to the semiconductor body on both sides and the coefficients of thermal expansion of which are at least substantially equal to that of the semiconductor body and which are connected over a large area to plane surfaces of metal members having any desired coefficients of thermal expansion, particularly a different coefficient of thermal expansion, is characterized by at least one screw connection forcing the carrier plates against the surfaces of the metal members.

A method of producing a semiconductor arrangement is known wherein a semiconductor body is provided with electrode plates which have substantially the same coefficients of thermal expansion as the semiconductor body, wherein furthermore the electrode plates are provided with seatings which are hard-soldered on and which have the same coefficients of thermal expansion as the metallic component to which the semiconductor element is to be connected and which has a different coefficient of thermal expansion from the semiconductor body, and wherein the seating is provided with a thread and screwed to a corresponding counter thread on the metallic component. By this method, therefore, parts which have the same coefficient of heat expansion are screwed together, whereas the parts with different coefficients of thermal expansion are connected by a hard-soldered joint which has to take up the internal stress.

Furthermore, a surface-contact rectifier is known wherein the electrode and the heat sink bear against one another solely under pressure and wherein the latter is provided, at the surface with which it bears against the electrode, with a coating of a flexible metallic material which is applied by soldering or welding.

In contrast to this, in the semiconductor arrangement according to the invention, those parts which have different coefficients of thermal expansion, are merely pressed together by at least one screw. In the absence of a layer of solder, therefore, no fatigue phenomena can appear in the common connecting surface. Surprisingly, it has been found that despite the absence of a soft, flexible connecting layer, the electrical and thermal transmission is excellent and is not inferior to thermal soldered joints. In addition, a high mechanical strength is obtained and any risk of deterioration in the active semiconductor element through high soldering temperatures is avoided. A further advantage of the semiconductor arrangement according to the invention is the case of replacement of the active semiconductor element. Finally not only may copper be used for the metal members as usual, but also aluminum, in particular because the poor solderability of aluminum no longer matters.

The invention will be explained in more detail with reference to the following drawing in which a representative embodiment of the improved semiconductor rectifier structure is most illustrated in central vertical section.

With reference now to the drawing, the improved semiconductor arrangement comprises, for the lower part, a copper base 6 which is provided with a stud for screwing into a cooling fin (not shown), and a substantially cylindrical hard glass part 22 which is connected to the housing part 6 by the fusion of glass-to-metal. The upper part of the semiconductor arrangement is composed moreover of an upper current-connection 23 of copper, a flexible portion 24 of stranded copper cable, and a top contact 25, likewise of copper. A cylindrical exhaust tube 26 is soldered into the upper connection 23. Furthermore, the hard glass portions 27 and 28 are hard-soldered to the upper connection 23. Both the wire cable portion 24 and the top contact 25 include a concentric hole which becomes narrower in the top contact forming a shoulder. The upper and lower portions of the semiconductor arrangement are connected by the hard-glass seal 29 which joins the parts 22 and 28.

The semiconductor element, which is composed of a semiconductor body 1 of silicon with molybdenum or tungsten carrier plates 2 and 3 soldered onto both sides, lies on the bottom of a recess **6*a* provided in the base part 6 of the housing. The semiconductor element is drilled centrally. A tapped hole which lies on the same axis is drilled in the base part 6. The hole in the top contact 25 and in the semiconductor element is lined by a sleeve 30 of insulating material such as ceramic. The top contact 25 is pressed against the carrier plate 3, and the lower carrier plate 2 against the base 6 of the housing, by means of the screw 31 screwed into the base. A uniform distribution of pressure is assured by a layer 32 contacted by the underside of the head screw 31 as well as by layers 12 and 13. Layer 12, in the form of gold foil, is placed between the confronting surfaces of carrier plate 2 and base 6, and layer 13, also of gold foil is placed between the confronting surfaces of carrier plate 3 and contact member 25. These two layers as well as the similar layer 32 are provided to ensure uniform distribution of the pressure which is exerted between the various components when screw 31** is tightened. However, these layers are not essential to ensure a satisfactory electrical and thermal transmission if the surfaces of the various components involved in the assembly are made sufficiently plane.

The assembly of the semiconductor arrangement shown in the drawing is effected in the following sequence: The hard glass portions 22, 27 and 28 are provided already soldered to the base 6. The semiconductor body 1 with the carrier plates 2 and 3 soldered on is placed on the base 6 of the housing with the insertion of the layers 12 and 13 where appropriate. The upper portion, composed of the current connection 23 with the exhaust tube 26, the wire 24, the top contact 25, and the insulating sleeve 30, is placed on top and screwed to the semiconductor element and the bottom of the housing by means of the screw 31. The upper connection 23 is connected to the hard glass portion 27 by soldering. Finally, after a thorough degassing process, the exhaust tube 26 is pinched off.

We claim:

1. In a semiconductor arrangement wherein the semiconductor element comprises carrier plates soldered to a semiconductor body at opposite sides thereof and have a coefficient of thermal expansion at least substantially the same as that of the semiconductor body and which are respectively connected over a large area to plane surfaces of first and second metal members having any desired coefficient of thermal expansion, the improvement wherein said semiconductor body, carrier plates and metal members correlated therewith comprise axially aligned bores, a stud disposed in said bores pressing said carrier plates against the plane surfaces of the metal members, said stud having a thread on one end and a head on the other, and an insulating sleeve lining said bores, the head of said stud being electrically insulated from and applying pressure against the surface of said first metal member and the body of the stud passing through said sleeve and the threaded end thereof screwed into the bore in said second metal member.

2. A semiconductor arrangement as defined in claim 1 wherein the bore in said first metal member includes an internal shoulder against which the pressure from the head of said stud is applied.

3. A semiconductor arrangement as defined in claim 1 which further includes a pressure distributing layer interposed between the head of said stud and the surface of said first metal member and another pressure distributing layer interposed between the surface of said second metal member and the surface of the carrier plate correlated therewith.

References Cited

UNITED STATES PATENTS

| | | | |
|---|---|---|---|
| 2,959,718 | 11/1960 | Kadelburg et al. | 317—234 |
| 3,237,063 | 2/1966 | Keller | 317—234 |
| 3,221,219 | 11/1965 | Emeis et al. | 317—234 |

JAMES D. KALLAM, Primary Examiner

U.S. Cl. X.R.

29—580